United States Patent
Droz

(10) Patent No.: US 8,127,997 B2
(45) Date of Patent: Mar. 6, 2012

(54) METHOD FOR MOUNTING AN ELECTRONIC COMPONENT ON A SUBSTRATE

(75) Inventor: François Droz, La Chaux-de-Fonds (CH)

(73) Assignee: Nagraid S.A., Le Cret-du-Locle (CH)

( * ) Notice: Subject to any disclaimer, the term of this patent is extended or adjusted under 35 U.S.C. 154(b) by 509 days.

(21) Appl. No.: 10/556,398

(22) PCT Filed: May 12, 2004

(86) PCT No.: PCT/IB2004/050645
§ 371 (c)(1),
(2), (4) Date: Nov. 10, 2005

(87) PCT Pub. No.: WO2004/102469
PCT Pub. Date: Nov. 25, 2004

(65) Prior Publication Data
US 2006/0226237 A1    Oct. 12, 2006

(30) Foreign Application Priority Data
May 13, 2003  (CH) .................................. 0832/03

(51) Int. Cl.
G06K 5/00 (2006.01)
G06K 19/06 (2006.01)
(52) U.S. Cl. ........................ 235/492; 235/380
(58) Field of Classification Search .................. 235/492, 235/380; 361/727, 737
See application file for complete search history.

(56) References Cited

U.S. PATENT DOCUMENTS

| 4,457,798 | A | * | 7/1984 | Hoppe et al. | 156/248 |
| 5,598,032 | A | * | 1/1997 | Fidalgo | 235/492 |
| 5,773,812 | A | * | 6/1998 | Kreft | 235/492 |
| 5,880,934 | A | * | 3/1999 | Haghiri-Tehrani | 235/492 |

(Continued)

FOREIGN PATENT DOCUMENTS
DE    4401458 A1 * 7/1995
(Continued)

OTHER PUBLICATIONS

International Search Reports.

*Primary Examiner* — Thien Mai
(74) *Attorney, Agent, or Firm* — Harness, Dickey & Pierce, P.L.C.

(57) ABSTRACT

This invention proposes a manufacturing process for a transponder in the form of a card or a label able to resist to flexions or twisting without interrupting the connections of the electronic components. The process of assembling at least one electronic component including sensibly flat conductive areas that are connected to conductive tracks placed on the surface of a generally flat substrate comprises the steps of placing the substrate on a work surface, the face including conductive tracks being oriented upwards, placing the electronic component into a cavity of the substrate situated in a zone including the conductive tracks, the conductive areas of the component coming into contact with the corresponding tracks of the substrate and applying a layer of insulating material which extends at once on the electronic component and at least on a substrate zone surrounding said component. This process implies that the contact between the conductive areas of the electronic component and the conductive tracks of the substrate realizes an electric connection ensured by the pressure of application of the insulating material layer on the electronic component.

14 Claims, 2 Drawing Sheets

U.S. PATENT DOCUMENTS

| | | | |
|---|---|---|---|
| 5,969,951 A * | 10/1999 | Fischer et al. | 361/737 |
| 6,072,698 A * | 6/2000 | Houdeau et al. | 235/492 |
| 6,160,526 A * | 12/2000 | Hirai et al. | 235/491 |
| 6,542,444 B1 * | 4/2003 | Rutsche | 369/14 |
| 6,607,135 B1 * | 8/2003 | Hirai et al. | 235/492 |
| 6,851,618 B2 * | 2/2005 | Halope | 235/492 |
| 2002/0110955 A1 | 8/2002 | Patrice et al. | |
| 2003/0116634 A1 * | 6/2003 | Tanaka | 235/492 |
| 2003/0226901 A1 * | 12/2003 | Kim et al. | 235/492 |

FOREIGN PATENT DOCUMENTS

| | | |
|---|---|---|
| DE | 19645083 A1 * | 5/1998 |
| EP | 0 786 357 A1 | 9/1995 |
| EP | 0 756 442 B1 | 7/1996 |
| EP | 0 952 545 B1 | 10/1998 |
| EP | 1544787 A1 * | 6/2005 |
| JP | 01020197 A * | 1/1989 |
| WO | WO 00/55808 | 9/2000 |

* cited by examiner

METHOD FOR MOUNTING AN ELECTRONIC COMPONENT ON A SUBSTRATE

This application is the national phase under 35 U.S.C. §371 of PCT International Application No. PCT/IB2004/050645, which has an international filing date of May 12, 2004, which designated the United States of America and which claims priority on Switzerland Patent Application CH0832/03, filed May 13, 2003, the entire contents of which are hereby incorporated herein by reference.

FIELD OF THE INVENTION

This invention relates to an assembly process of an electronic component on an insulating support called a substrate that includes a plurality of conductive tracks. This process can be applied during the manufacturing of transponders in the form of a card or an electronic label which thickness is generally low.

Electronic label is understood to mean an assembly comprising at least one insulating support, an antenna and an electronic component, usually a chip. The card or electronic label made using the process according to the invention is found in numerous applications as a mean of identification, control or payment.

The subject of this invention is particularly focused on the assembly of at least one electronic component on the substrate of a thin card or label. An electronic component is an element such as: a chip, a capacity, a resistance, a diode, a fuse, a battery, a display, or also an assembly comprising a coated chip provided with contact areas.

BACKGROUND OF THE INVENTION

Cards or labels are known by those skilled in the art where components are mounted on a substrate, on which conductive tracks and connection areas (usually in copper) are engraved. The components are usually bonded, then their contacts are welded onto the tracks or onto the conductive connection areas of the substrate. The electric contact between the connection areas of the component and those of the substrate is achieved by means such as: bonding with a conductive glue, welding by means of ultrasounds, welding by means of a hot applied tin-based alloy.

Cards are also known that are provided with components whose contacts are provided with claws or spikes (bumps) which are embedded by pressing into the engraved connection areas of the substrate. The document WO0055808 describes the production of a connection between a chip and the contact areas of an antenna by hot lamination. The contacts of the chip include bumps that are embedded in the conductive material of the antenna's connection area producing a deformation in these areas.

The connections of components on substrate conductors can also be obtained by means of conductive wires welded on one hand on a substrate conductor and on the other hand on a conductive area of the component.

In order to protect the components and the circuits wired in this way, an epoxy resin can be cast on all or part of the substrate surface in order to coat the circuit components assembly. According to another embodiment, an insulating sheet is laminated on all or part of the substrate that cons the component or components and the conductive tracks in the vicinity.

The document EP0786357 describes a contactless card that comprises a chip mounted on a substrate and connected to an antenna coil placed on the edge of the substrate. The chip is placed in a substrate zone located on the exterior of the loop formed by the antenna coil in the vicinity of one of the edges of the card. This off-center position of the chip protects the latter against stresses caused by bending of the card. The connection of the antenna coil to the chip is carried out by hot pressing the bumps of the chip contacts on the end tracks of the coil. According to a variant this connection is achieved by soldering of wires ("wire-bonding") between the chip contacts and the tracks deriving from the coil.

The document US2002/0110955 describes a manufacturing method of an electronic module comprising a substrate and at least one chip. The latter is either glued on one of the substrate faces, or hot pressed inside the substrate thickness in order to be level with the surface. Furthermore, the substrate includes conductive areas to which the chip is connected by means of conductive tracks made by silk-screening, according to a preferred variant. The chip contacts include bumps on which tracks, thus applied, end up to con the bumps. A final step consists in applying a thin film or a protection lacquer on the chip and on the conductive tracks located near the chip.

The transponders whose components are assembled according to the known processes described above present a disadvantage at the level of quality and reliability of the connection between the component and conductors. In fact, this connection can be interrupted totally or intermittently due to mechanical stresses applied to the transponder during its use. More particularly, the thin transponders such as cards or electronic labels are easily deformable by flexion or twisting. These stresses can appear during the normal application of the transponder such as for example on a label that is applied on the surface of an object presenting protrusions.

Despite the protection of the components by coating or lamination of an insulating film, the connections of the components are subjected to internal traction and compression causing their breakage when the transponder is deformed. This phenomenon is further increased during repetitive deformations leading to the strain of the connection that will finally break after a few flexions or torsions suffered by the transponder.

SUMMARY OF THE INVENTION

The aim of this invention is to avoid the drawbacks described above, namely to increase reliability and quality of the electric connection between the electronic component or components and the substrate conductive tracks while reducing the manufacturing costs of the transponder.

The aim of this invention is also to offer a manufacturing process for this type of transponder in the form of a card or a label that is capable of resisting flexions or twisting without interrupting component connections.

These aims are achieved by an assembly process of at least one electronic component including sensibly flat conductive areas that are connected to conductive tracks placed on the surface of a generally flat insulating support called a substrate characterized by the following steps:
 placing the substrate on a work surface, the face including conductive tracks being oriented upwards,
 placing the electronic component into a cavity of the substrate situated in a zone including the conductive tracks, the conductive areas of the component coming into contact with the corresponding tracks of the substrate,
 applying a layer of insulating material which extends at the same time on the component and at least on one substrate zone surrounding said component, in such a way that the electric connection between the conductive areas and conductive tracks is ensured by the pressure of the insulating layer on the component.

The electronic component also called the electronic module is usually formed by a chip whose contacts located on one of its faces are set off on a conductive film, called "lead frame" constituting contact areas that extend the small dimensions of the chip contacts. In one embodiment example, the opposite face of the chip is coated by an insulating material that is usually epoxy resin. The "lead frame" allows the facilitation of the connection of the electronic module on the conductive tracks of a printed circuit. The majority of semiconductive components mounted on the surface of printed circuits include such "lead frames".

The conductive tracks of the substrate are defined in an extensive way. They can be made up of pads or conductive areas connected to the conductive segments of a circuit engraved chemically or deposited by silk-screening on the substrate. For example, this type of circuit can constitute the antenna of a contactless card that serves to supply energy to the card and exchange digital data by means of a terminal.

It is important to note that the method according to the invention does not require any welding, nor any kind of anchoring of component contacts on the circuit conductors. It is thus sufficient for the contact surfaces of component and substrate to have been pressed one against the other by presenting approximately flat surfaces. The component is retained on the substrate by the insulating material covering the latter by extending on its periphery.

The cavity in the substrate is used to maintain temporarily the component between its placing step and the depositing of the insulating layer. This cavity can be carried out by means of different ways such as milling or cutting a window by stamping, or simply through the deformation of the substrate by heating the component during its placing on the substrate.

The advantage of mounting the component according to this method resides in the fact that the contact between the component and the circuit conductor is maintained when the transponder is bent or twisted. In fact, the internal forces appearing at the level of connection tend to make the contacts slide one on the other without producing any breakage as in the case of a welded or anchored connection. Repeated stresses exerted on the transponder cause a "self-cleaning" effect on the conductors by rubbing their surfaces together. Therefore, the performance of the connection as well as its reliability and its electric conductivity are greatly improved.

BRIEF DESCRIPTION OF THE DRAWINGS

The invention will be better understood thanks to the following detailed description that refers to the enclosed drawings given as a non-limitative example, in which.

DETAILED DESCRIPTION OF THE PREFERRED EMBODIMENTS

Figure 1:
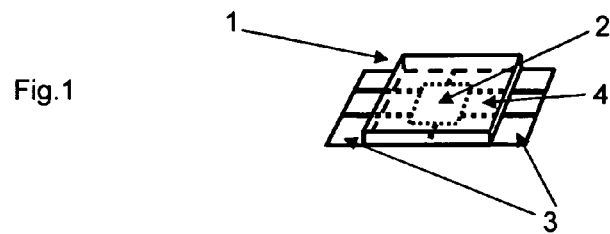
FIG. 1 represents a component in the form of an electronic module provided with contact areas.

The component (1) in FIG. 1 forming an electronic module includes a chip (2) protected by coating (4) in insulating material such as an epoxy resin. The chip contacts are connected to contact areas (3) formed inside a tinned copper conductive sheet, for example, forming the "lead frame".

Figure 2:
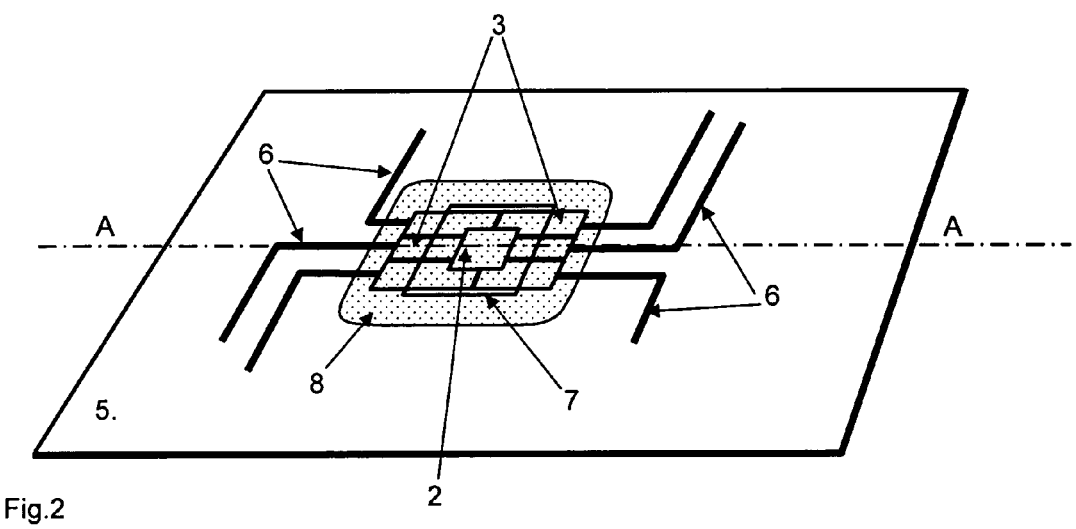
FIG. 2 represents an overview of a thin transponder comprising a substrate and a component provided with contact areas protected by an insulating layer
Figure 3:
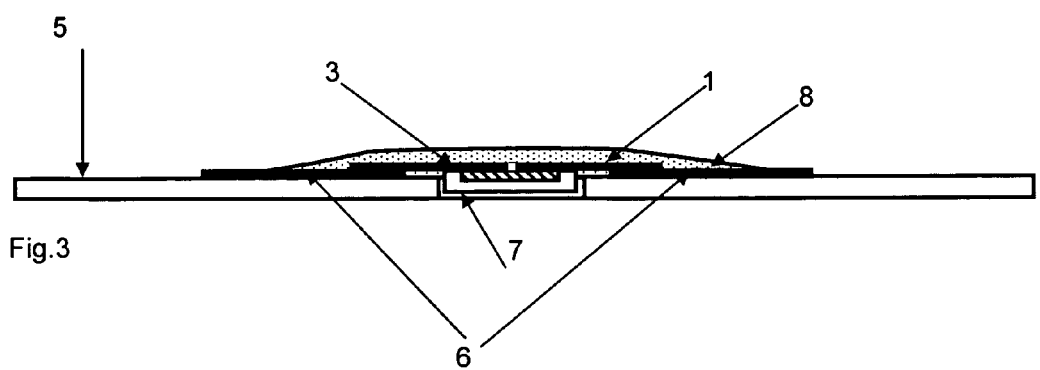
FIG. 3 shows an enlarged section of a the transponder in FIG. 2 according to the axis A-A

FIG. 2 and the section according to the illustrated axis A-A in FIG. 3 show an example of a transponder that includes a thin substrate (5) that can be deformed on which the component (1) in FIG. 1 is placed. The upper surface of said substrate includes tracks or conductive areas (6) engraved, glued or printed by silk-screening, for example. The coated part (4) of the component (1) is inserted into a cavity (7) made up of milling or a window cut into the substrate in order to minimize the final thickness of the transponder. The conductive tracks (6) of the substrate are in contact with the component conductive areas (3) only by means of pressure without using welding or conductive glue. The approximately flat surfaces in contact in this way do not include any particular type of relief serving as an anchorage point. The maintenance of the component on the substrate and the pressure on its contacts are assured by an insulating layer (8) extended at the same time on the visible surface of component and on a substrate zone in the vicinity of the component. According to a variant, this insulating layer can be extended on the whole upper surface of the substrate.

A transponder achieved in this way can be deformed without any interruption of component connections on the substrate conductors. The contact areas of the "lead frame" will have a tendency to rub on the substrate tracks under the action of internal forces produced by the transponder deformation.

Figure 4:
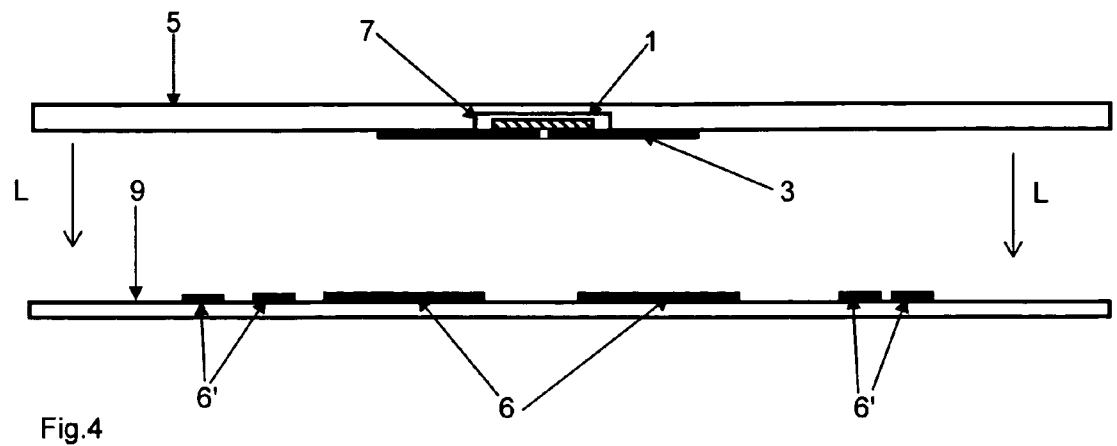
FIG. 4 shows a section of a transponder assembly comprising two substrates and one component provided with contact areas

FIG. 4 shows a variant of the transponder assembly according to the invention method, where the coated part (4) of the component (1) is inserted into a cavity or located in a window of a first insulating substrate (5). The conductive areas (3) of the component are thus arranged on the lower surface of the substrate (5). A second substrate (9) that includes, on its upper surface, a plurality of conductive tracks such as for example an antenna (6') and contact tracks (6) situated facing those of the component is applied on the first substrate (5). The assembly of two substrates (5, 9) is carried out by gluing or by hot or a cold lamination according to the arrows L. The electric contact of the component with the tracks (6) of the second substrate is achieved by means of the lamination or gluing pressure. The final thickness of the transponder is limited to that of the two superimposed substrates (5, 9).

According to another variant, the component (1) does not include a coating, the chip (2) is thus directly protected by the first substrate (5). The chip is either inserted into a cavity (7) that is pre-worked into the substrate, or hot pressed into the substrate material in such a way that the contact areas (3) of the component (1) are applied against the inner surface of substrate (5).

The direct insertion of the component into the substrate material without a pre-worked cavity is carried out by heating the chip during its placing that leads to the local softening and a deformation of the substrate. The chip is then pressed into the substrate by means of an adapted tooling to the desired depth. The cavity constituted in this way is adapted to the chip outline and maintains the position of the chip or the component assembly during the lamination of the second substrate.

The second substrate (9) is assembled in the same way as in the previous variant. The thickness of the first substrate (5) can in this way be reduced to a value closer to that of the chip.

Figure 5:
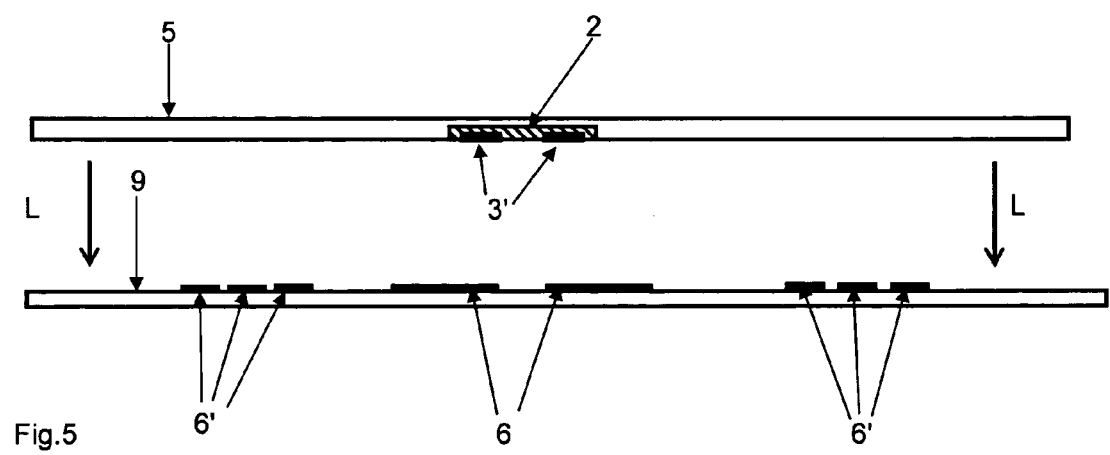
FIG. 5 shows a section of a transponder assembly comprising two substrates and one component made up of a chip inserted in one of the substrates.

FIG. 5 represents a variant of the transponder assembly where the component is made up by the chip (2) alone, free of "lead frame". In this case, as in the previous one, the chip (2) is either housed in a pre-worked cavity or pressed into the material of the first substrate (5) in such a way as to make its contact surfaces (3') appear on the substrate surface (5) level.

The second substrate (9) is provided with conductive tracks (6) facing those of the chip intended for its connection by means of the pressure of gluing or lamination of the assembly of the two substrates (5, 9). The contact surfaces (3') of the chip (2) are of course flat allowing their friction on the corresponding conductive tracks of the second substrate in case of the transponder deformation.

The insulating layer deposited on the component and on all or part of the surface of the substrate as well as on the second substrate laminated onto the first substrate can include a decoration or a marking on the external surface characterizing the final transponder. The first substrate can furthermore also include decoration on the opposite side to that supporting the conductive tracks.

The method according to the invention is also applied to the assembly of cards called "dual" that is to say comprising on one hand a set of flat contacts showing on the level of one of the external faces of the card and on the other hand an internal antenna in the form of a set of conductive tracks. This contacts set is placed on one of the faces of a module and each contact is linked to a conductive area on the opposite side of the module. The latter is inserted into a cavity provided with a window cut into a first substrate whose thickness is approximately equal to that of the module. The contacts set shows on the surface level of the substrate constituting the external face of the card and the conductive areas of the opposite side lean against the conductive tracks of a second substrate assembled on the first substrate.

A chip or a supplementary electronic module as previously described, completing this assembly, can be mounted on either of the substrates. The conductive areas of this module are connected by pressure on the corresponding conductive tracks of the surface of one of the substrates.

It is also possible to assemble and then laminate more than two superimposed substrates comprising conductive tracks and the electronic modules whose conductive areas are connected by the lamination pressure to the corresponding conductive tracks arranged on the faces of either of the substrates.

The invention claimed is:

1. A process for assembling a flexible transponder including at least one electronic component made up of a chip provided with contacts on one of the faces of the chip, said contacts being set off on a conductive film constituting flat conductive areas that extend the contacts of the chip in a plane over the chip, the conductive areas being connected to conductive tracks placed on a surface of a planar insulating substrate, comprising:
    placing the substrate on a work surface, the face including conductive tracks being oriented upwards,
    placing the electronic component into a cavity of the substrate situated in a zone including the conductive tracks, the chip being inserted into the cavity, the conductive areas of the electronic component coming into contact with the corresponding conductive tracks of the substrate, and
    forming a layer of insulating material which extends concurrently on the electronic component and at least on the zone of the substrate surrounding said electronic component,
    wherein the conductive areas of the electronic component and the conductive tracks of the substrate are in contact to achieve a permanent electric connection via a pressure of application of the insulating material layer on the electronic component, and after forming the layer of insulating material, the contacted conductive areas of the electronic component and the conductive tracks of the substrate are configured to rub together when repeated stressed are exerted on the substrate.

2. The process according to claim 1, wherein the electronic component is coated by an insulating material on the face of the chip opposite to the face provided with contacts.

3. The process according to claim 1, wherein the cavity is obtained by heating the chip of the electronic component, then pressing said chip into the substrate material so that the conductive areas of said electronic component are applied against the surface of the substrate.

4. The process according to claim 1 wherein the cavity is formed by milling or by stamping a window.

5. A process for assembling a flexible transponder including at least one electronic component made up of a chip provided with contacts on one of the faces of the chip, said contacts being set off on a conductive film constituting fiat conductive areas that extend the
    contacts of the chip in a plane over the chip, comprising:
        placing a first substrate on a work surface, placing the chip of the electronic component into a cavity of the first substrate, the conductive areas of the electronic component being applied against the surface of the first substrate, and
    assembling the first substrate provided with the electronic component on a second substrate provided with conductive tracks, so that the conductive areas of the electronic component applied against the surface of the first substrate connect to the conductive tracks of the second substrate, wherein the conductive areas of the electronic component and the conductive tracks of the second substrate are in contact to achieve a permanent electric connection via a pressure of application of the second substrate on the electronic component, and after the assembling, the conductive areas of the electronic component and the conductive tracks of the second substrate are configured to rub together when repeated stresses are exerted on the substrates.

6. The process according to claim 5, wherein the electronic component is coated by an insulating material on the face of the chip opposite to the face provided with contacts.

7. The process according to claim 5, wherein the cavity is obtained by heating the chip of the electronic component then pressing said chip into the substrate material so that the conductive areas of said electronic component are applied against the surface of the substrate.

8. The process according to claim 1, wherein the cavity is formed by milling or by stamping a window.

9. A process for assembling a flexible transponder including at least one electronic component made up of a module including a set of fiat contacts on one of the faces of the module, each contact of the set being linked with a contact area on the opposite face, comprising:
    placing a first substrate on a work surface, placing the chip of the electronic component into a cavity provided with a window cut into a first substrate, the set of flat contacts shows on the surface level of said first substrate, and
    assembling the first substrate provided with the electronic component on a second substrate provided with conductive tracks, so that the conductive areas of the opposite face of the electronic component connect to the conductive tracks of the second substrate, wherein the conductive areas of the electronic component and the conductive tracks of the second substrate are in contact to achieve a permanent electric connection via a pressure of application of the second substrate on the electronic component, and after the assembling, the conductive areas of the electronic component and the conductive tracks of the second substrate are configured to rub together when repeated stresses are exerted on the substrates.

10. The process according to claim 9, wherein at least one module or a supplementary chip is mounted in one of the substrates, said module including conductive areas connected by pressure on the corresponding conductive tracks of either of the substrates.

11. The process according to claim 10, further comprising a supplementary step of gluing and pressing the assembly formed by the superposition of the substrates.

12. The process according to claim 1, wherein the conductive areas of the electronic component and the conductive tracks of the substrate are in direct contact to obtain the permanent electric connection.

13. The process according to claim 1, wherein the conductive areas of the electronic component and the conductive tracks of the substrate are in constant contact to obtain the permanent electric connection.

14. The process according to claim 1, wherein the layer of insulating material extends concurrently over the electronic component and the zone of the substrate surrounding the electronic component.

* * * * *